US007017764B2

(12) United States Patent
Okada

(10) Patent No.: US 7,017,764 B2
(45) Date of Patent: Mar. 28, 2006

(54) ELECTRICAL JUNCTION BOX

(75) Inventor: Eiji Okada, Hiroshima (JP)

(73) Assignee: Yazaki Corporation, Tokyo (JP)

( * ) Notice: Subject to any disclaimer, the term of this patent is extended or adjusted under 35 U.S.C. 154(b) by 18 days.

(21) Appl. No.: 10/420,808

(22) Filed: Apr. 23, 2003

(65) Prior Publication Data

US 2003/0230574 A1 Dec. 18, 2003

(30) Foreign Application Priority Data

Apr. 23, 2002 (JP) .......................... P2002-120950

(51) Int. Cl.

| | |
|---|---|
| ***H01J 5/02*** | (2006.01) |
| ***H02G 3/10*** | (2006.01) |
| ***H02G 3/14*** | (2006.01) |
| ***H02G 13/00*** | (2006.01) |

(52) U.S. Cl. ........................ 220/3.2; 220/3.3; 220/3.8; 220/3.92; 220/3.94; 220/4.02; 220/476; 220/480; 174/48; 174/50

(58) Field of Classification Search ............... 220/4.02, 220/476, 480, 3.92, 3.2, 3.3, 3.8, 3.94; 174/50, 174/48, 50.5

See application file for complete search history.

(56) References Cited

U.S. PATENT DOCUMENTS

| | | | | |
|---|---|---|---|---|
| 2,380,782 | A * | 7/1945 | Owens | 220/3.94 |
| 5,310,075 | A * | 5/1994 | Wyler | 220/4.02 |
| 5,532,431 | A * | 7/1996 | Saka et al. | 174/52.3 |
| 5,864,091 | A * | 1/1999 | Sumida | 174/50 |
| 6,077,102 | A * | 6/2000 | Borzi et al. | 439/364 |
| 6,206,726 | B1 * | 3/2001 | Takahashi et al. | 439/573 |
| 6,545,217 | B1 * | 4/2003 | Sato | 174/50 |
| 6,629,619 | B1 * | 10/2003 | Sato et al. | 220/4.02 |
| 6,815,612 | B1 * | 11/2004 | Bloodworth et al. | 174/50 |

FOREIGN PATENT DOCUMENTS

JP 2002-58128 * 2/2002

* cited by examiner

*Primary Examiner*—Jes F. Pascua
*Assistant Examiner*—Niki M. Eloshway
(74) *Attorney, Agent, or Firm*—Sughrue Mion, PLLC

(57) ABSTRACT

An electrical junction box includes a main body, having a contain portion for containing electric function components therein, a lid member, covering an open part of the main body, a fixing leg, provided so as to extend from a side wall of the main box being near a butting area in which the lid member is engaged with the main body, and the fixing leg mounted to an exterior structure and a water prevention wall, provided on an upper face of a base part of a the fixing leg so as to prevent an intrusion of water into the butting area.

4 Claims, 4 Drawing Sheets

ELECTRICAL JUNCTION BOX

BACKGROUND OF THE INVENTION

The present invention relates to an electrical junction box, and more particularly to the electrical junction box in which an intrusion of water through a butting area between a body of the electrical junction box and a lid member can be prevented, especially, when the electrical junction box is mounted on a vehicle.

FIG. 4 is a perspective view generally showing an example of a related electrical junction box.

This electrical junction box 1 is intended to contain electrical function components such as fuses, relays and so on in a containing space which is defined by a body 2 of the electrical junction box and a lid member 3 covering an upper open part of the body 2 of the electrical junction box.

The electrical junction box 1 is fixed with bolts or the like to a vehicle panel (an exterior structure) or the like in an engine room by a plurality of fixing legs 4, 5 which are provided so as to extend from the body 2 of the electrical junction box.

There are various types of the fixing legs to be provided on the body 2 of the electrical junction box, in correspondence with a shape of an object to which the electrical junction box is to be mounted. However, in case where a position to be fixed with the bolts is relatively high as compared with a position at which the electrical junction box 1 is to be arranged, the fixing legs may be in a shape of a curved arm extending diagonally upwardly like the fixing legs 5 provided at a back face side, as shown in FIG. 4.

In this case, for the sake of mounting safety of the electrical junction box 1, the fixing legs 5 are not provided in a lower part of the body 2 of the electrical junction box, but rather provided on a possible uppermost part of the body 2 of the electrical junction box, as shown in FIG. 5, that is, at a position close to a butting area 7 between the body 2 and the lid member 3.

By the way, high pressure cleaning water has been recently employed to clean an interior of the engine room. On such occasion, when the high pressure cleaning water is splashed over surroundings of the electrical junction box 1, there occurs a water flow as shown by an arrow A in FIG. 6, and the high pressure cleaning water violently flows into a gap 8 in the butting area 7 along an upper face of the fixing legs 5 in the shape of a curved arm. Accordingly, there has been such an anxiety that the high pressure cleaning water may intrude with water pressure to an interior of the electrical junction box 1.

On the other hand, in case where a packing 9 is provided in the butting area 7 between the body 2 of the electrical junction box and the lid member 3 in order to prevent an intrusion of the water to the interior of the electrical junction box 1, it has been a problem that a separate member, namely, the packing 9 is required, which may incur a rise of cost.

SUMMARY OF THE INVENTION

It is therefore an object of the present invention to provide a favorable electrical junction box in which an intrusion of water can be prevented without incurring a rise of cost.

In order to achieve the above object, according to the present invention, there is provided an electrical junction box comprising:

a main body, having a contain portion for containing electric function components therein;

a lid member, covering an open part of the main body;

a fixing leg, provided so as to extend from a side wall of the main box being near a butting area in which the lid member is engaged with the main body, and the fixing leg mounted to an exterior structure; and a water prevention wall, provided on an upper face of a base part of a the fixing leg so as to prevent an intrusion of water into the butting area.

Preferably, the water prevention wall is integrally formed with the fixing leg.

Preferably, the water prevention wall is provided so as to project upwardly in parallel with the side wall of the main body.

Preferably, the water prevention wall is formed in a shape of a rectangular flat plate.

Preferably, the water prevention wall is formed in a shape of a curved plate.

Preferably, a convex portion is provided on an outer face of the water prevention wall.

In the above configuration, because the water prevention wall is provided on the upper face of the base part of the fixing leg in a projecting manner, the water flowing along the upper face of the fixing leg will collide against the water prevention wall, even in case where high pressure cleaning water has been splashed over this fixing leg.

Then, the water which has collided against the water prevention wall will not flow into the gap at the butting area between the body of the electric junction box and the lid with a strong force, because running force of the water is decreased or a direction of the flow is dispersed, and hence, the intrusion of the water into the interior of the electrical junction box will be prevented.

Further, the water prevention wall is provided in a projecting manner by integral molding with the body of the electrical junction box, there is no need of employing a separate part such as a packing, and a rise of the cost due to an increase of components in number and assembling works can be avoided.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

An embodiment of the invention will be described in detail referring to the attached drawings.

Figure 1:
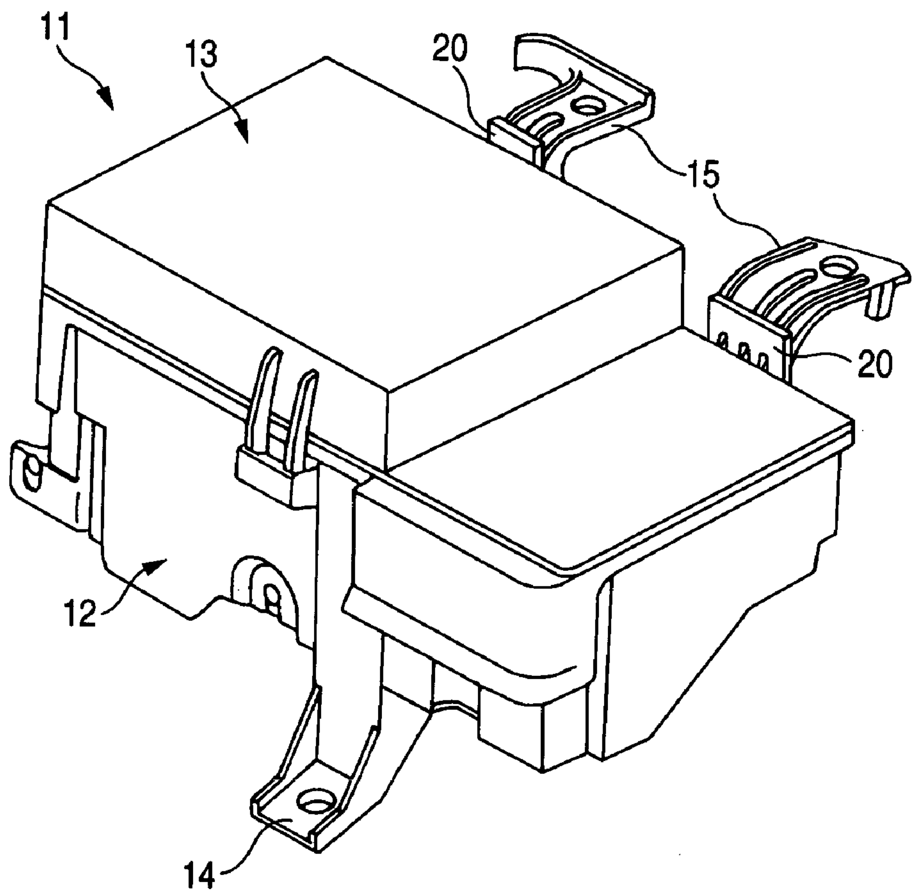
FIG. 1 is a perspective view showing a general structure of an electrical junction box according to an embodiment of the present invention.
Figure 2:
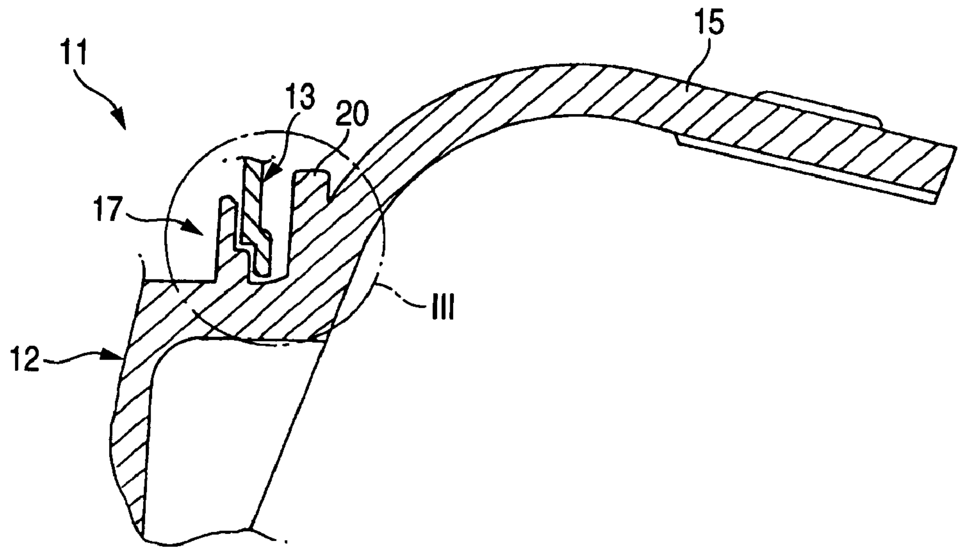
FIG. 2 is a sectional view of an essential part of the electrical junction box as shown in FIG. 1.
Figure 3:
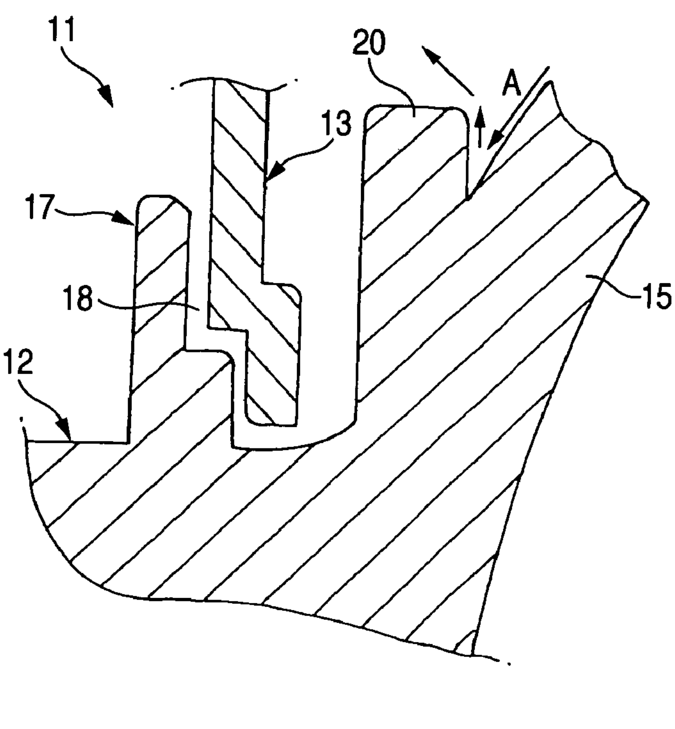
FIG. 3 is an enlarged sectional view of a part denoted by III in FIG. 2.
Figure 4:
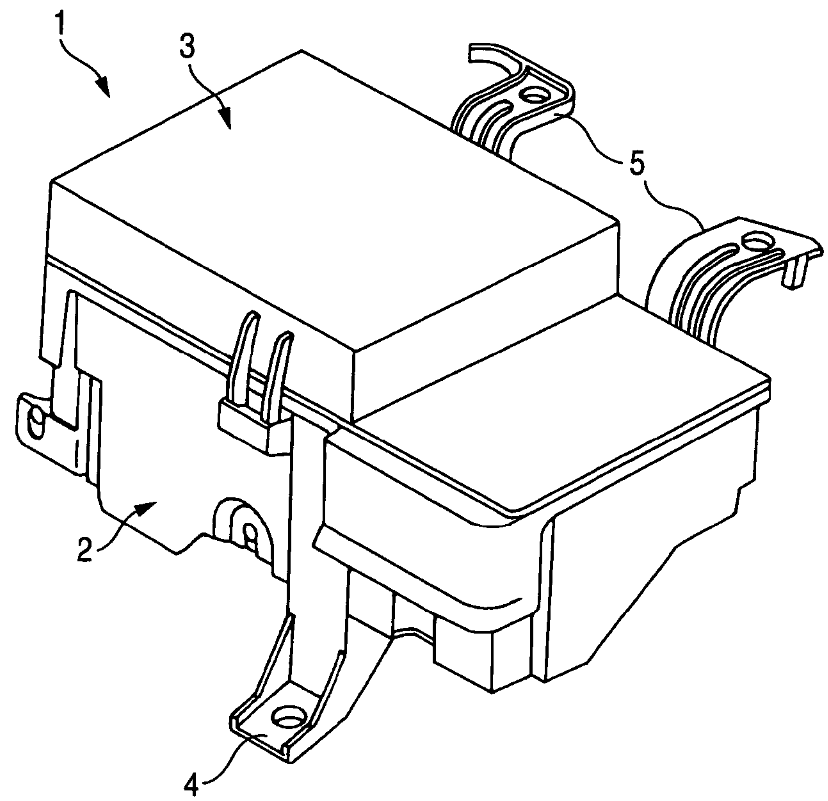
FIG. 4 is a perspective view showing a general structure of a related electrical junction box.
Figure 5:
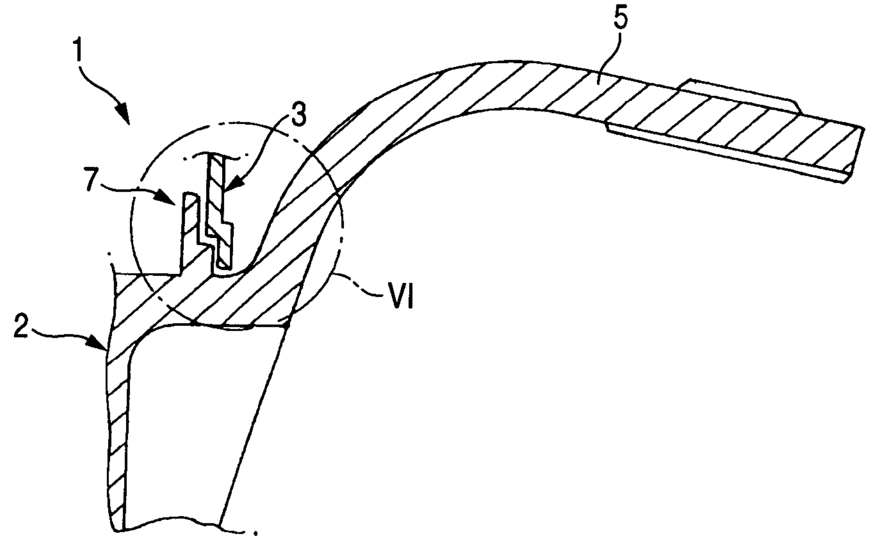
FIG. 5 is a sectional view of an essential part of the electrical junction box as shown in FIG. 4.
Figure 6:
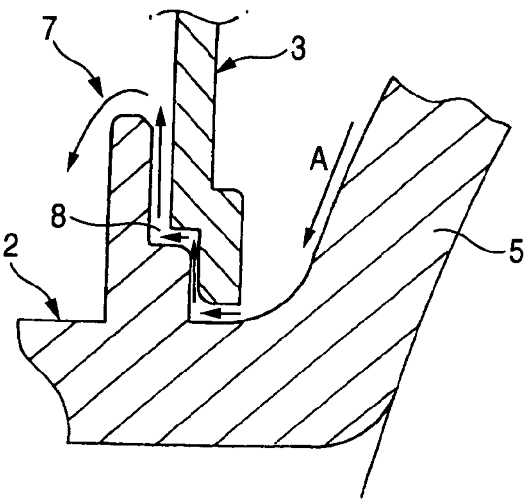
FIG. 6 is an enlarged sectional view of a part denoted by VI in FIG. 5.

FIG. 1 is a perspective view showing a general structure of an electrical junction box according to an embodiment of the invention, FIG. 2 is a sectional view of an essential part of the electrical junction box as shown in FIG. 1, and FIG. 3 is an enlarged sectional view of a part denoted by III in FIG. 2.

The electrical junction box 11 in the present embodiment is a fuse box for containing electrical function components such as fuses, relays in a containing space which is defined by a body 12 of the electrical junction box made of synthetic resin and a lid member 13 covering an upper open part of the body 12 of the electrical junction box and made of synthetic resin.

It is to be noted that inside the containing space of the body 12 of the electrical junction box, there is installed and fixed a relay and fuse storing part (not shown) which includes a plurality of fuse connector parts and relay connector parts for engaging and mounting the fuses or relays, and terminal connecting parts of a wire harness.

The electrical junction box 11 is fixed with bolts or the like to a vehicle panel (an exterior structure) or the like in an engine room, by way of a plurality of fixing legs 14, 15 which are provided so as to extend from the body 12 of the electrical junction box.

As shown in FIG. 1, a pair of the fixing legs 15 at a back face side are provided near a butting area 17 in the body 12 of the electrical junction box against the lid member 13 so as to extend diagonally upwardly in a shape of a curved arm, because places for the electrical junction box to be fixed with the bolts are positioned relatively high.

Moreover, each of the fixing legs 15 has a water prevention wall 20 provided on an upper face of its base part in a projecting manner, for preventing an intrusion of water into the butting area 17. The water prevention wall 20 is integrally formed with the body 12 of the electrical junction box as well as the fixing legs 15, when the body 12 is formed by injection molding.

The water prevention wall 20 is provided so as to project upwardly in parallel with side walls of the lid member 13 and the body 12 of the electrical junction box, and formed in such a size and shape, as shown in FIG. 3, that the water (an arrow A) flowing along the upper face of the fixing leg 15 can be reliably blocked.

When the electrical junction box 11 is mounted to the vehicle panel, the fixing leg 14 provided at a lower end of a front face of the body 12 of the electrical junction box, and a pair of the fixing legs 15 provided near the butting area 17 in an upper part of the back face are fastened with bolts to fix the electrical junction box.

When high pressure cleaning water for cleaning an interior of the engine room is splashed over surroundings of the electrical junction box 11, the high pressure cleaning water is liable to flow into the electrical junction box 11 along the upper face of each of the fixing legs 15.

However, because the water prevention wall 20 is provided on the upper face of the base part of the fixing leg 15, the water flowing along the fixing leg 15 will collide against this water prevention wall 20, and its running force will be decreased or a direction of the flow will be dispersed.

Accordingly, the high pressure cleaning water will not flow into a gap 18 in the butting area 17 between the body 12 of the electrical junction box and the lid member 13, and as the results, intrusion of the water into the interior of the electrical junction box 11 can be prevented.

Figure 7:
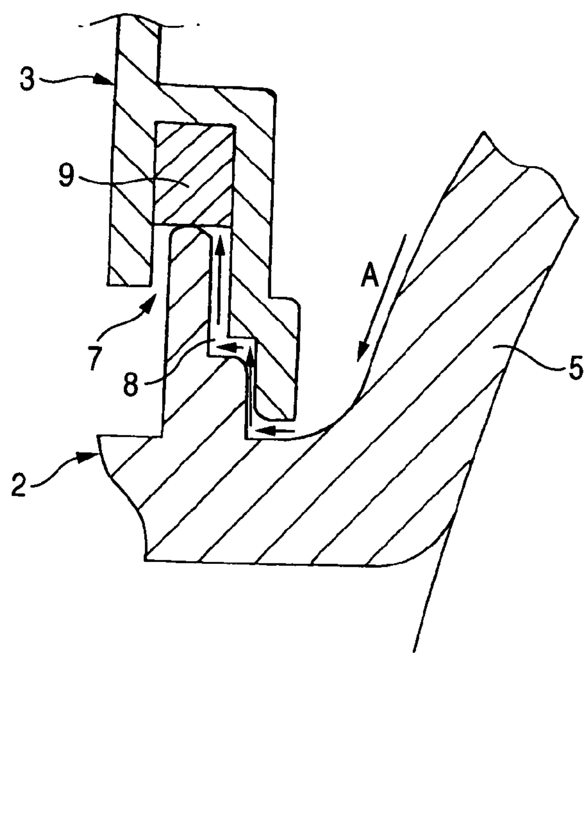
FIG. 7 is an enlarged sectional view of an essential part of another related electrical junction box.

Further, because the water prevention wall 20 is provided in a projecting manner by integral molding with the body 12 of the electrical junction box, there is no need of employing a separate part such as the related packing 9 which is shown in FIG. 7, and a rise of the cost can be avoided.

It is to be noted that a structure including the body of the electrical junction box, the lid member, the fixing legs, the water prevention walls, and so on in the electrical junction box according to the invention is not limited to the structure of the embodiment, but it is needless to say that various forms can be employed on the basis of spirit of the invention.

For example, although the electrical junction box 11 in the embodiment is so constructed that the relay and fuse storing part is installed and fixed in the containing space in the body 12 of the electrical junction box, and the upper open part of the body 12 of the electrical junction box is covered with the lid member 13, the electrical junction box may have such a structure that the body 12 of the electrical junction box is composed of a frame-like relay storing part which stores fuse connector parts and relay connector parts, and a lower cover which covers a lower part of the relay storing part, and an upper cover, namely a lid member, is covered over the relay storing part.

Moreover, although the embodiment has been described referring to the fuse box as an example of the electrical junction box, it is apparent that the invention can be applied to other electrical junction boxes such as a junction box.

Further, although the water prevention wall 20 is formed in a shape of a rectangular flat plate in the embodiment, various shapes can be employed as the water prevention wall, provided that the shapes are helpful for decreasing the running force of the collided water or for dispersing the direction of the flow.

For example, the water prevention wall can be formed in a shape of a curved plate, or undulations may be formed on an outer side face of the water prevention wall for enabling the water to be easily dispersed.

What is claimed is:

1. An electrical junction box, comprising:

a main body, having a containing portion for containing electric function components therein, said main body having side walls extending therearound;

a lid member provided on an upper side of the main body for covering an open part of the main body, said lid member engaging an upper end of said side walls defining a butting area;

a fixing leg extending from the uppermost end of one of the side walls of the main body and above the butting area, the fixing leg having a base end portion connected to the main body and a distal end portion opposite thereto which is mounted to an exterior structure; and a water prevention wall extending from an upper face of the base end portion of the fixing leg so as to be adjacent the butting area to prevent an intrusion of water into the butting area.

2. The electrical junction box as set forth in claim 1, wherein the water prevention wall is integrally formed with the fixing leg.

3. The electrical junction box as set forth in claim 1, wherein the water prevention wall is provided so as to project upwardly in parallel with the one of the side walls of the main body.

4. The electrical junction box as set forth in claim 1, wherein the water prevention wall is formed in a shape of a rectangular flat plate.

* * * * *